United States Patent
Tokunaga (10) Patent No.: US 7,539,223 B2
(45) Date of Patent: May 26, 2009

(54) LIGHT EMITTING DEVICE

(75) Inventor: Seiichi Tokunaga, Suita (JP)

(73) Assignee: Sanyo Electric Co., Ltd., Osaka (JP)

( * ) Notice: Subject to any disclaimer, the term of this patent is extended or adjusted under 35 U.S.C. 154(b) by 9 days.

(21) Appl. No.: 11/524,259

(22) Filed: Sep. 21, 2006

(65) Prior Publication Data

US 2007/0064751 A1 Mar. 22, 2007

(30) Foreign Application Priority Data

Sep. 22, 2005 (JP) ............................. 2005-276056

(51) Int. Cl.
*H01S 3/10* (2006.01)
(52) U.S. Cl. .......................................... 372/23; 372/68
(58) Field of Classification Search .................. 372/23, 372/22, 68
See application file for complete search history.

(56) References Cited

U.S. PATENT DOCUMENTS

| 6,950,584 B1 * | 9/2005 | Suzuki | 385/122 |
| 2004/0066140 A1 * | 4/2004 | Omoto | 313/512 |
| 2007/0164661 A1 * | 7/2007 | Kuma | 313/501 |

FOREIGN PATENT DOCUMENTS

| JP | 2000-031531 | 1/2000 |
| JP | 2005-311136 | 11/2005 |

\* cited by examiner

*Primary Examiner*—Minsun Harvey
*Assistant Examiner*—Kinam Park
(74) *Attorney, Agent, or Firm*—NDQ&M Watchstone LLP

(57) ABSTRACT

A light emitting device includes a light emitting element which emits light with a first wavelength; and a light emitting conversion unit for converting the light with the first wavelength by using wavelength conversion materials including a short wavelength conversion material and a long wavelength conversion material, the short wavelength conversion material being that which emits light with a second wavelength longer in wavelength than the light with the first wavelength, by absorbing the light with the first wavelength, and the long wavelength conversion material being that which emits light with a wavelength longer than the second wavelength by absorbing the light with the first wavelength. A proportion of the short wavelength conversion material of the wavelength conversion materials included in a first region is smaller than that of the short wavelength conversion material of the wavelength conversion materials included in the entire light emitting conversion unit, and a proportion of the short wavelength conversion material of the wavelength conversion materials included in a second region is larger than that of the short wavelength conversion material of the wavelength conversion materials included in the entire light emitting conversion unit.

8 Claims, 6 Drawing Sheets

LIGHT EMITTING DEVICE

CROSS REFERENCE TO RELATED APPLICATION

This application is based upon and claims the benefit of priority from prior Japanese Patent Application P2005-276056 filed on Sep.22, 2005; the entire contents of which are incorporated by reference herein.

BACKGROUND OF THE INVENTION

1. Field of the Invention

The present invention relates to a light emitting device.

2. Description of the Related Art

Conventionally, light emitting devices using a technology that converts a light wavelength irradiated from a light emitting diode (LED) chip by a color conversion material have been developed. Among such light emitting devices, since a white LED is expected to be used for lighting, it is required for a while LED to have high-color rendering properties. Here, the high-color rendering properties refer to a property having a light emitting spectrum near sunlight. As the color rendering properties increase, the state of a color of an object becomes closer to a state of the color of the object which is seen under natural light In addition, it is also important to cause a light emitting device itself to be more efficient.

As a white LED, for example, it has been conventionally tried that a blue light emitting LED chip and a yellow light emitting conversion material emitting yellow light are combined so as to create white light to achieve high color rendering properties.

Figure 1:
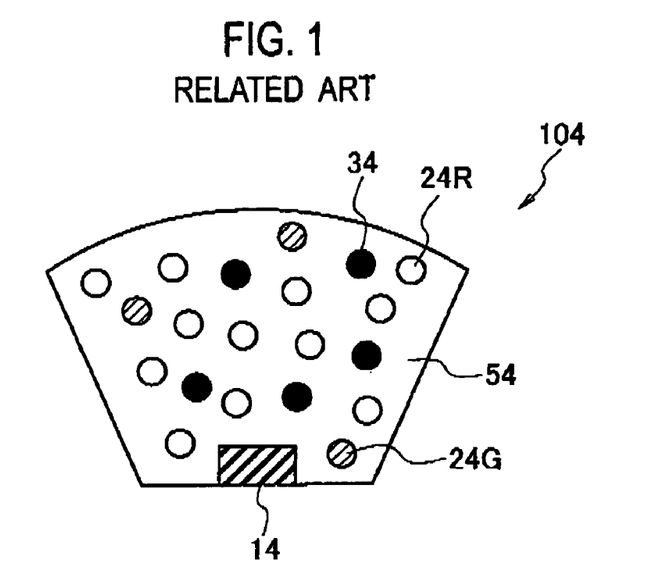
FIG. 1 is a cross-sectional view of a light emitting device according to a related technology.

Recently, for the purpose of obtaining a white LED with further higher color rendering properties, a light emitting device as shown in FIG. 1 has been proposed. For example, according to a light emitting device 104 shown in FIG. 1, there has been proposed that an ultraviolet light emitting LED chip as a light emitting element 14, a blue light emitting color conversion material 34, which emits blue light, a green light emitting color conversion material 24C; which emits green light, and a red light emitting color conversion material 24R, which emits red light, are combined, so that white light is created to achieve further higher color rendering properties (see, for example, Japanese Patent Laid-pen No. 2000-31531).

As shown in FIG. 1, the light emitting device 104 described above disperses the blue light emitting color conversion material 34, the green light emitting color conversion material 24C; and the red light emitting color conversion material 24R in a transparent resin 54 so as to car out color conversion by using excitation light of the ultraviolet light emitting LED chip, which is the light emitting element 14.

Figure 2:
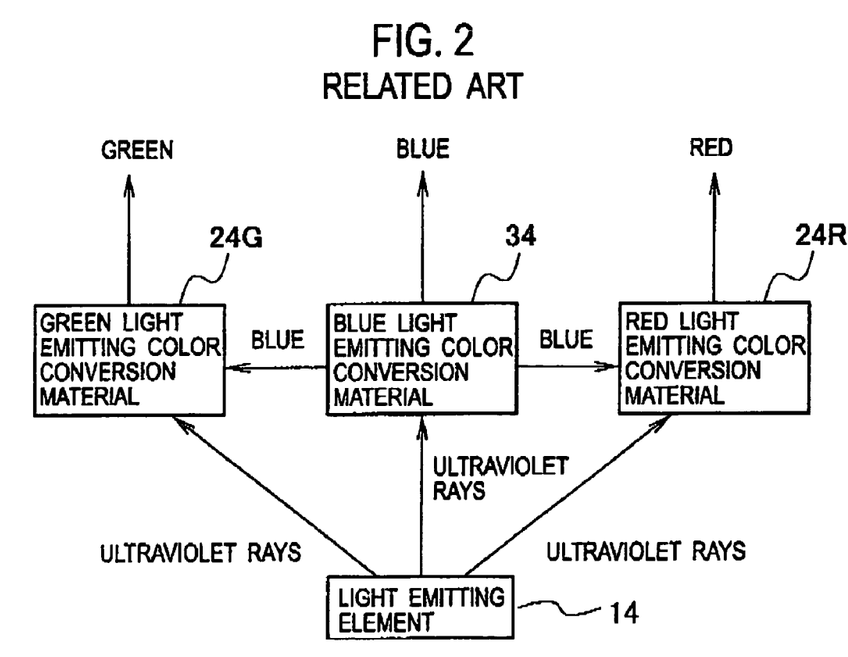
FIG. 2 is a diagram for describing light emitting processes in the light emitting device according to the related technology.

Here, light emitting processes of the light emitting device 104 of FIG. 1 are shown in FIG. 2. As shown in FIG. 2, in the above-described light emitting device 104, the blue light emitting color conversion material 34 absorbs ultraviolet rays emitted from the light emitting element 14 as the excitation light to emit blue light. Specifically, electrons in the blue light emitting color conversion material 34 absorb the excitation light to transit from a grand state to an excitation state, and then emits blue light, which has a longer wavelength than that of ultraviolet rays, when returning to the grand state again. Similarly, the red light emitting color conversion material 24R absorbs ultraviolet rays as excitation light to emit red light In addition, the green light emitting color conversion material 24G absorbs ultraviolet rays as excitation light to emit green light In this manner, white light with high color rendering properties is created by using Pious kinds of color conversion materials.

However, since the above-described light emitting device 104 disperses the color conversion materials in the transparent resin 54, there is a problem in that light emitted by the color conversion materials may be absorbed again as excitation light of different color conversion materials.

For example, there may be a case where blue light emitted by the blue light emitting color conversion material 34 in the circumference of the light emitting element 14 shown in FIG. 1 is absorbed as excitation light by the green light emitting color conversion material 24G or the red light emitting color conversion material 24R before the light reaches outside.

In this case, as shown in FIG. 2, the blue light, which reaches at the green light emitting color conversion material 24G or the red light emitting color conversion material 24R, is absorbed as excitation light to emit green or red light In this manner, light emitted from color conversion materials, which emit a short wavelength, has large energy, and is absorbed again by other color conversion materials, which results in an increase of conversion processes.

In addition, when compared with energy of excitation light absorbed by the color conversion materials, energy of light emission emitted from the color conversion materials is small.

As a result, there is a problem in that conversion efficiency of light emitted from the light emitting device 104 in relation to light emitted from the light emitting element 14 of the above-described light emitting device 104 becomes smaller. In particular, this problem is obvious in blue light, which has large energy and therefore is easily absorbed again by other color conversion materials.

SUMMARY OF THE INVENTION

The present invention has been made in view of the above-described problems. An object of the present invention is to provide a light emitting device with excellent efficiency in converting light emitted from a light emitting element An aspect of the present invention inheres in a light emitting device including a light emitting element for emitting light with a first wavelength and a light emitting conversion unit for converting the light with the first wavelength by using wavelength conversion materials including a short wavelength conversion material and a long wavelength conversion material, the short wavelength conversion material being that which emits light with a second wavelength longer in wavelength than the light with the first wavelength by absorbing the light with the first wavelength, and the long wavelength conversion material being that which emits light with a wavelength longer than the second wavelength by absorbing the light with the first wavelength, in which a proportion of the short wavelength conversion material of the wavelength conversion materials included in a first region of the light emitting conversion unit is smaller than that of the short wavelength conversion material of the wavelength conversion materials included in the entire light emitting conversion unit, and a proportion of the short wavelength conversion material of the wavelength conversion materials included in a second region, which is a region more distant from the light emitting element than the first region in the light emitting conversion unit is greater than that of the short wavelength conversion material of the wavelength conversion materials included in the entire light emitting conversion unit.

According to such aspect, the proportion of the short wavelength conversion material of the wavelength conversion materials included in the second region, which is the region more distant from the light emitting element than the first region, is greater than that of the short wavelength conversion material of the wavelength conversion materials included in the entire light emitting conversion unit, so that the short wavelength material is disposed in a place near the outside of the light emitting conversion unit.

As a result, as described above, large amount of the short wavelength conversion material is disposed in the second region, so that the light with the second wavelength emitted from the short wavelength conversion material is allowed to be easily emitted to the outside of the light emitting conversion unit without being absorbed by the long wavelength conversion material. That is, an increase in amount of a process that the light with the second wavelength emitted from the short wavelength conversion material is absorbed again by the long wavelength conversion material can be reduced. Therefore, a light emitting device with excellent efficiency in converting light emitted from the light emitting element can be provided.

With respect to the light emitting device according to the aspect, the short wavelength conversion material may be included more in the second region than the long wavelength conversion material.

The light emitting conversion unit includes the short wavelength conversion material in the second region more than the long wavelength conversion material, so that the light with the second wavelength emitted from the short wavelength conversion material is allowed to be Other easily emitted to the outside of the light emitting conversion unit without being absorbed by the long wavelength conversion material. Therefore, a light emitting device with further excellent efficiency in converting light emission of the light emitting element can be provided.

With respect to the light emitting device according to the aspect, a wavelength selecting material may be included- The wavelength selecting material is provided between the first region and the second region The wavelength selecting material penetrates light with a wavelength longer than the first and the second wavelengths, and reflects the light with the second wavelength.

According to such aspect, the light with the wavelength longer than the second wavelength emitted from the long wavelength conversion material in the first region transmits through the wavelength selecting material and is emitted to the outside of the light emitting conversion unit through the second region. In addition, the light with the first wavelength, which has been emitted from the light emitting element and has not been absorbed by the long wavelength conversion material, transmits through the wavelength selecting material to be transmitted to the second region.

In addition, the light with the second wavelength emitted from the short wavelength conversion material in the second region is reflected by the wavelength selecting material to be finally emitted to the outside of the light emitting conversion unit. That is, the light with the second wavelength emitted from the short wavelength conversion material becomes difficult to be emitted to the first region where large amount of the long wavelength conversion material absorbing the light with the second wavelength is present.

Therefore, an increase in amount of a conversion process that the first light is absorbed again by the long wavelength conversion material after being converted by the short wavelength conversion material can be reduced.

With respect to the light emitting device according to the aspect, each of the first region, the second region, and the wavelength selecting material may be formed in a sheet form.

Each of the fist region, the second region, and the wavelength selecting material is formed in a sheet form, so that the first region, the second region, and the wavelength selecting material can be treated as one set. Thereby, a light emitting device can be easily manufactured by providing, for example, a light emitting element and a first region, a second region, and a wavelength selecting material as one set on the light emitting element.

In addition, according to such aspect, by exchanging with a first region formed in a sheet form in which the long wavelength conversion material is increased or decreased or second region sheet formed in a sheet form in which the short wavelength conversion material is increased or decreased, a light emitting device emitting a different light wavelength can be easily manufactured.

DETAILED DESCRIPTION OF THE INVENTION

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

Specific sizes and the like have to be determined by referring to the following description. In addition, it is natural that portions, which are different in relation or proportion of respective sizes between drawings, are included.

First Embodiment (Light Emitting Device)

Figure 3:
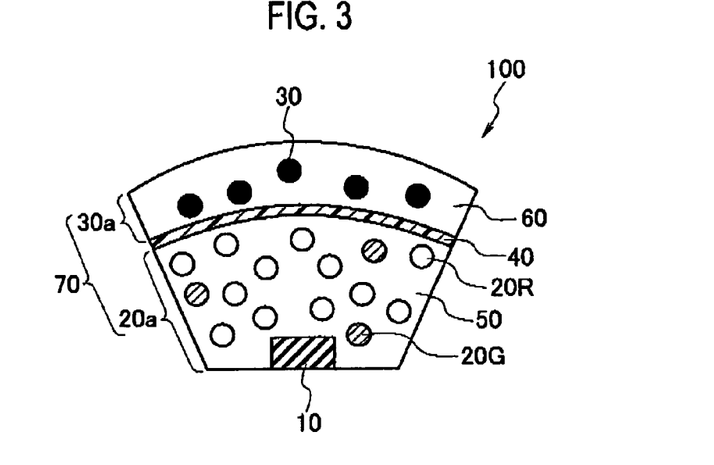
FIG. 3 is a cross sectional view of a light emitting device according to a first embodiment of the present invention.

A light emitting device 100 according to a first embodiment of the present invention will be described below. FIG. 3 is a cross sectional diagram showing a light emitting device 100 (white LED) of the first embodiment, which emits white light.

The light emitting device 100 according to the first embodiment is, as shown in FIG. 3, provided with a light emitting conversion unit 70 and a light emitting element 10 mounted in the light emitting conversion unit 70.

The light emitting conversion unit 70 is configured by a fist region 20*a*, which is a region close to the light emitting element 10, a second region 30a, which is a region more distant from the light emitting element 10 than the first region 20a, and a wavelength selecting material 40, which is disposed between the first region 20a and the second region 30a. It is to be noted that in FIG. 3 wiring for mounting the light emitting element 10 and the like are omitted.

In a case where white light is caused to be emitted from the light emitting device 100, the light emitting element 10 emits ultraviolet rays as light with a first wavelength. Specifically, it is preferable to use a GaN-based material that emits ultraviolet rays with a wavelength peak ranging from 380 to 420 nm in consideration of complementary color relation of a light emitting wavelength from the light emitting conversion unit 70, deterioration of transparent resins 50 and 60, which are disposed in the light emitting conversion unit 70, or the like.

In the first region 20a, the transparent resin 50 is disposed in the circumference of the mounted light emitting element 10. In the transparent resin 50, a red light emitting color conversion material 20R as a long wavelength conversion material and a green light emitting color conversion material 200 as a long wavelength conversion material are included.

In the second region 30a, the transparent resin 60 is disposed, and a blue light emitting color conversion material 30 as a short wavelength conversion material is included in the transparent resin 60.

For the red light emitting color conversion material 20R, the green light emitting color conversion material 20G, and the blue light emitting color conversion material 30, well-known color conversion materials are respectively used. Particle diameters of the three kinds of color conversion materials are between 3 and 10 μm, and specific gravities thereof are between 3.5 and 4.5 g/cm$^3$. By causing the particle diameters and specific gravities of the three kinds of color conversion materials to be equal, the color conversion materials can be substantially uniformly dispersed in the transparent resins 50 and 60.

The transparent resins 50 and 60 can be any material as long as they can include a color conversion material inside thereof For example, thermosetting epoxy resins such as an alicyclic epoxy resin and a nitrogen-containing epoxy resin and a silicon resin are preferable, but beyond these, other epoxy resins or the like can be used.

It is to be noted that these transparent resins 50 and 60 can include, as one of various additives, a colorant for cutting a desired wavelength, a titanium oxide diffusing desired light, an inorganic diffusing agent such as an aluminum oxide, organic diffusing agents such as a melanin resin, a guanamine resin, a benzoguanamine resin, an ultraviolet absorber for increasing light resistance of resins, an antioxidant, accelerators such as organic carboxylic acid zinc, acid anhydride, and zinc chelate compounds.

Since for other materials, well-known materials are used, the description thereof is omitted.

(Light Emitting Process)

Figure 4:
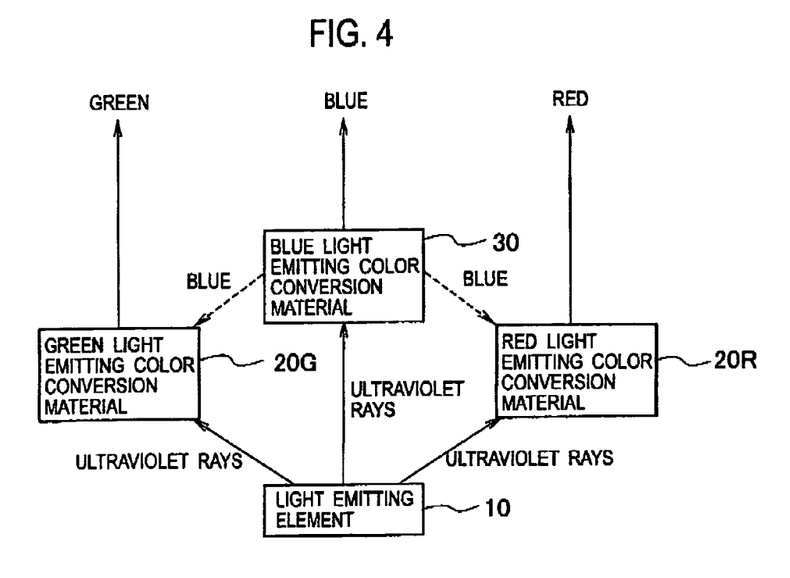
FIG. 4 is a diagram for describing light emitting processes in the light emitting device according to the first embodiment.

Next, light emitting processes of the light emitting device 100 of FIG. 3 are shown in FIG. 4. As shown in FIG. 4, in the light emitting device 100, the blue light emitting color conversion material 30 emits blue light, the green light emitting color conversion material 20G emits green light, and the red light emitting color conversion material 20R emits red light, so that white light with high color rendering properties is created.

Here, the blue light emitting color conversion material 30 absorbs ultraviolet rays emitted from the light emitting element 10 as excitation light to emit blue light. Specifically, electrons in the blue light emitting color conversion material 30 absorb the excitation light to transit from a ground state to an excitation state, and emit blue light, which has a wavelength longer than that of ultraviolet rays, when returning to the ground state again Similarly, the red light emitting color conversion material 20R absorbs ultraviolet rays as excitation light to emit red light In addition, the green light emitting color conversion material 20G absorbs ultraviolet rays as excitation light to emit green light.

In addition, the blue light emitted from the blue light emitting color conversion material 30 has large energy, and therefore is absorbed by the green light emitting color conversion material 20G or the red light emitting color conversion material 20R to emit green or red light.

However, the light emitting device 100 according to the present embodiment is provided with a wavelength selecting material 40 between a first region 20a and a second region 30a. The wavelength selecting material 40 transmits, for example, green light or red light therethrough as light with a wavelength longer than those of ultraviolet rays and reflects blue light. Accordingly, the blue light emitted from the blue light emitting color conversion material 30 in the second region 30a is reflected by the wavelength selecting material 40 so as to be emitted as blue light to the outside without being absorbed by the green light emitting color conversion material 20G or the red light emitting color conversion material 20R.

In this manner, the light emitting device 100 can create white light with high color rendering properties by disposing a plurality of color conversion materials.

(Method for Manufacturing the Light Emitting Device)

Figure 5:
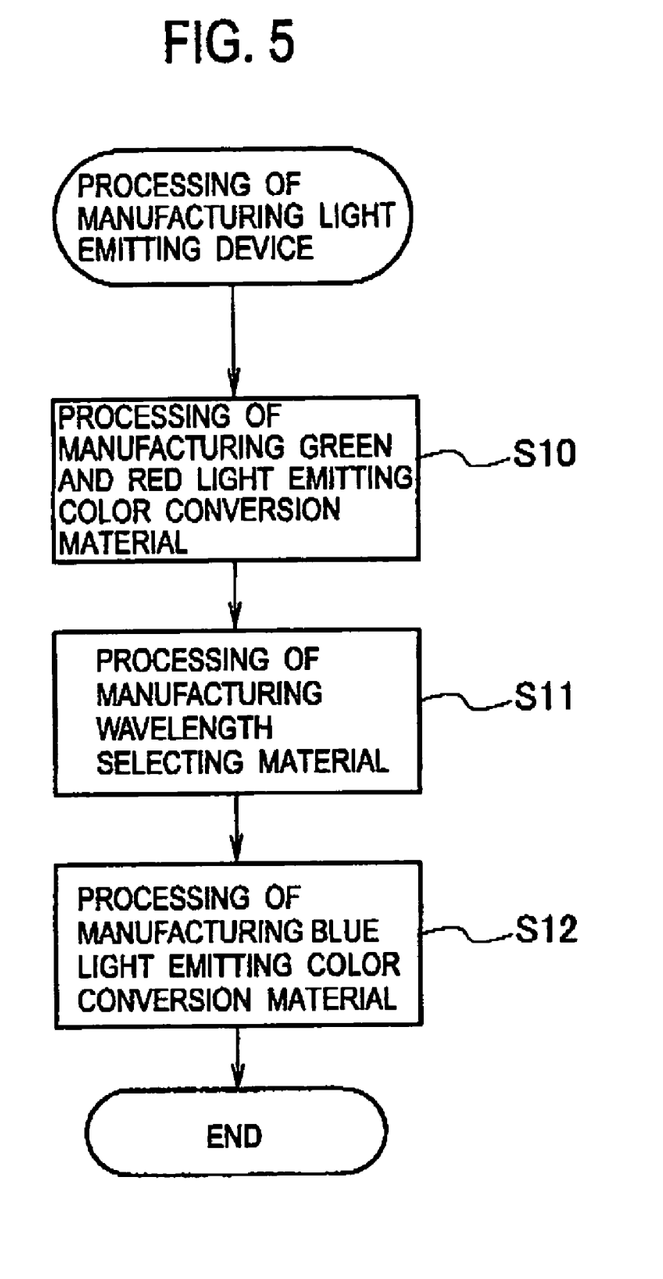
FIG. 5 is a flowchart showing a method for manufacturing the light emitting device according to the first embodiment.

Next, a method for manufacturing the light emitting device 100 according to the first embodiment will be described by referring to FIGS. 3 and 5. FIG. 5 is a flowchart of a method for manufacturing the light emitting device 100 according to the first embodiment.

In step S10 shown in FIG. 5, processing of manufacturing green and red light emitting color conversion materials is carried out. Here, as shown in FIG. 3, there is formed a first region 20a including the green light emitting color conversion material 20G and the red light emitting color conversion material 20R.

Specifically, in the circumference of the mounted light emitting element 10, a transparent resin 50 including the green light emitting color conversion material 20G and the red light emitting color conversion material 20R is applied to be cured. At this time, for example, the green light emitting color conversion material 20G and the red light emitting color conversion material 20R are weighed such that the green light emitting conversion material 200 and the red light emitting color conversion material 20R respectively become 6% and 24% in weight ratio in relation to the resin applied to an entire light emitting conversion unit 70.

Next, the green light emitting color conversion material 20G and the red light emitting color conversion material 20R are mixed to be dispersed in the transparent resin 50. Thereafter, a light emitting element 10 is disposed. The transparent resin 50 is applied by a well-known method onto a mounting member to be the wired light emitting conversion unit 70 and is cured under a heating condition of 150° C. and three hours.

In step S11, processing of manufacturing the wavelength selecting material is carried out. Here, as shown in FIG. 3, a wavelength selecting material 40 is formed. Specifically, the wavelength selecting material 40 is formed in the outside of the first region 20a and on the opposite side of the light emitting element 10. The wavelength selecting material 40 can be made of a material which itself is in a film form or a material which is mixed in a resin.

In step S12, processing of manufacturing the blue light emitting conversion material is carried out Here, as shown in FIG. 3, the blue light emit color conversion material 30 is formed. Specifically, the parent resin 60 including the blue light emitting color conversion material 30 is formed. For example, the blue light emitting color conversion material 30 is weighed such that the blue light emitting conversion material 30 becomes 10% in weight ratio in relation to the resin applied to the entire light emitting conversion unit 70.

Next, the blue light emitting color conversion material 30 is dispersed in the apparent resin 60. Thereafter, the transparent resin 60 is applied by the well-known method onto the wavelength selecting material 40 and is cured under the heating condition of 150° C. and three hours.

As described above, the light emitting device 100 can be manufactured.

Operations and Effects

According to the above-described light emitting device 100 of the first embodiment, the light emitting conversion unit 70 is configured by the first region 20a, the second region 30a, and the wavelength selecting material 40 between the first region 20a and second region 30a. The first region 20a includes the green light emitting color conversion martial 20G and the red light emitting color conversion material 20R. In addition, the second region 30a includes the blue light emitting conversion material 30.

By disposing the blue light emitting color conversion material 30 in the second region 30a in this manner, the blue light emitted from the blue light emitting color conversion material 30 is allowed to be easily emitted to the outside of the light emitting conversion unit 70 without being absorbed by the green light emitting color conversion material 20G and the red light emitting color conversion material 20R. That is, an increase in amount of a conversion process that the blue light emitted from the blue light emitting conversion material 30 is absorbed again by the green light emitting conversion material 20G and the red light emitting color conversion material 20R to be converted to green and red light, respectively, can be reduced In addition, the blue light emitted from the blue light emitting color conversion material 30 is reflected by the wavelength selecting material 40 and is then emitted from the opposite side of the wavelength selecting material 40 in the second region 30a to the outside of the light emitting conversion unit 70.

That is, the blue light becomes difficult to be emitted to the first region 20a in which the green light emitting color conversion material 20G and the red light emitting conversion material 20R, which absorb the blue light, are included. With this, the conversion process of the ultraviolet rays which have passed through the blue light emitting color converting material 30 and reached to the green light emitting color conversion material 20G or the red light emitting color conversion material 20R, can be reduced Thus, conversion efficiency can be further improved.

Modification of First Embodiment

A modification of the light emitting device 100 according to the first embodiment will be described below by referring to FIGS. 6 and 7. It is to be noted that with regard to the modified embodiments shown in FIGS. 6 and 7 differences between the light emitting device 100 according to the above-described first embodiment and the modification thereof will be mainly described.

Figure 6:
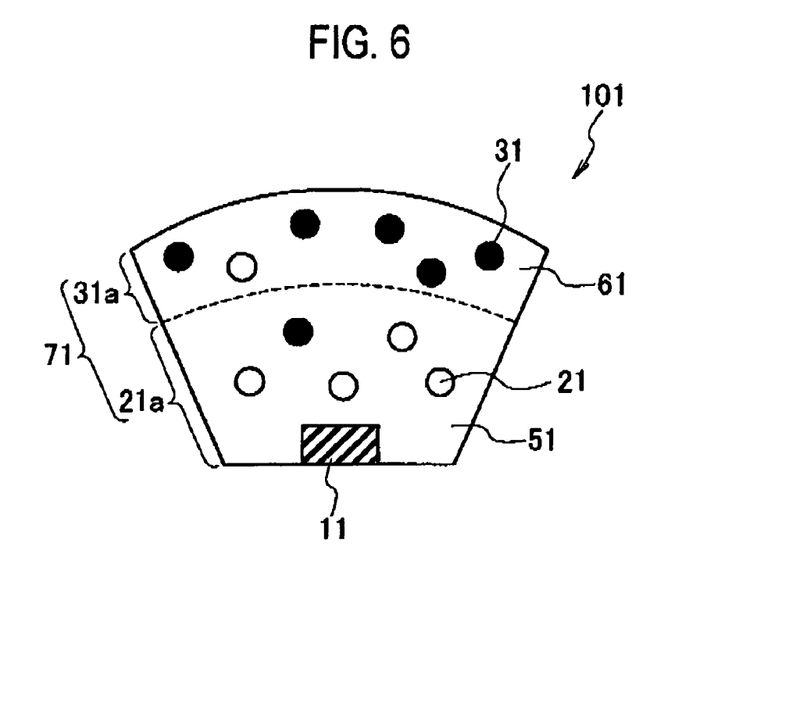
FIG. 6 is a cross sectional view of a modification of the light emitting device according to the first embodiment.

In a light emitting device 101 shown in FIG. 6, a light emitting conversion unit 71 does not include a wavelength selecting material 40, and is configured by a first region 21a and a second region 31a. In addition, as for color conversion materials, different from the three kinds of color conversion materials of the light emitting device 100, two kinds of color conversion materials of a red light emitting color conversion material 21 and a yellow light emitting color conversion material 31 are used.

Specifically, in a case where white light is emitted from the light emitting device 101, it is preferable to use a blue LED element which emits blue light as light with a first wavelength.

In addition, in the first region 21a, a transparent resin 51 is disposed in the circumference of the mounted light emitting element 11. In the transparent resin 51, different from the three kinds of color conversion materials of the light emitting device 100, the read light emitting color conversion material 21 as a long wavelength conversion material and the yellow light emitting color conversion material 31 as a short wavelength conversion material are included.

A proportion of the yellow light emitting color conversion material 31 of the wavelength conversion materials included in the first region 21a is smaller than that of the yellow light emitting conversion material 31 of the wavelength conversion materials included in the entire light emitting conversion unit 71.

In addition, a transparent resin 61 is disposed in the second region 31a. In the transparent resin 61, different from the three kinds of color conversion materials of the light emitting element 100, the red light emitting color conversion material 21 and the yellow light emitting color conversion material 31 are included.

A proportion of the yellow light emitting conversion material 31 of the wavelength conversion materials included in the second region 31a is larger than that of the yellow light emitting color conversion material 31 of the wavelength conversion materials included in the entire light emitting conversion unit 71.

It is preferable that the yellow light emitting color conversion material 31 in the second region 31a is, different from the three kinds of color conversion materials of the light emitting element 100, included more than the red light emitting color conversion material 21 in the second region 31a.

Different from the three kinds of color conversion materials of the light emitting device 100, well-known color conversion materials are respectively used for the red light emitting color conversion element 21 and the yellow light emitting color conversion material 31, similar to the case of the light emitting element 100 according to the first embodiment.

Such light emitting device 101 is formed in a manner that the transparent resin 51 including the red light emitting conversion material 21 is applied onto the circumference of the mounted light emitting element 11 and then is cured, and thereafter, the transparent resin 61 including the yellow light emitting color conversion material 31 is applied onto a surface, which is outside of the first region 21a and is the opposite side of the light emitting element 11. This manner is different from that for the three kinds of color conversion materials of the light emitting device 100.

In addition, it is also possible that after applying the transparent resin 51 including the red light emitting color conversion material 21 but before the resin is cured, the transparent resin 61 including the yellow light emitting color conversion material 31 is applied onto the surface, which is the outside of the first region 21a and is on the opposite side of the light emitting element 11, so as to cause the transparent resins 51 and 61 to be cured at the same time. In this manner, by causing the transparent resins 51 and 61 to be cured at the same time, the light emitting device 101 can be manufactured while reducing the manufacturing time.

It is to be noted that since, in this case, the transparent resin 61 is applied to the transparent resin 51 in an uncured state, a boundary between the transparent resins 51 and 61 is not clearly formed. For this reason, different from the three kinds of color conversion materials of the light emitting element 100, a portion of the red light emitting color conversion material 21 in the first region 21*a* flows into the second region 31*a* Similarly, a portion of the yellow light emitting color conversion material 31 in the second region 31*a* flows into the first region 21*a*.

In this manner, by using the blue LED for the light emitting element 11, different from the three kinds of color conversion materials of the light emitting device 100, and using the red light emitting color conversion material 21 and the yellow light emitting color conversion material 31, the light emitting device 101 can create white light by the two kinds of color conversion materials.

According to the light emitting device 101 shown in FIG. 6, by disposing a large amount of the yellow light emitting color conversion material 31, which is a short wavelength conversion material, in the second region 31*a*, yellow light emitted from the yellow light emitting color conversion material 31 is allowed to be easily emitted to the outside of the light emitting conversion unit 71 without being absorbed by the red light emitting color conversion material 21, different from the three kinds of color converting materials of the light emitting device 100, which are long wavelength conversion materials. That is, an increase in amount of a conversion process in which the yellow light emitted from the yellow light emitting color conversion material 31 is, different from the thee kinds of color conversion materials of the light emitting device 100, absorbed again by the red light emitting color conversion material 21 can be reduced.

In addition, the light emitting conversion unit 71 includes the yellow light emitting color conversion material 31 more than the red light emitting color conversion material 21 in the second region 31*a*, different from the three kinds of color conversion materials of the light emitting device 100. Therefore, the yellow light emitted from the yellow light emitting color conversion material 31 is allowed to be further easily emitted to the outside of the light emitting conversion unit 71 without being absorbed by the red light emitting color conversion material 21, different from the three kinds of color conversion materials of the light emitting device 100.

Figure 7:
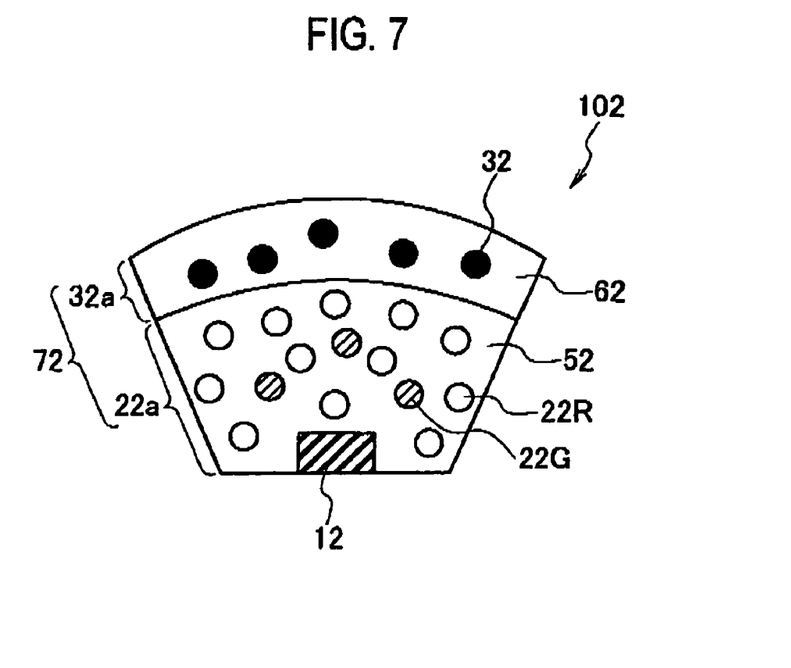
FIG. 7 is a cross sectional view of a modification of the light emitting device according to the first embodiment.

In a light emitting device 102 shown in FIG. 7, similar to the light emitting device 101 shown in FIG. 6, a light emitting conversion unit 72 does not include a wavelength selecting material 40, and is configured by a first region 22 *a* and a second region 32*a*. In addition, as for color conversion materials, similar to the three kinds of color conversion materials of the light emitting device 100, three kinds of color conversion materials of a red light emitting color conversion material 22R, a green light emitting color conversion material 22Q and a blue light emitting color conversion material 32 are used.

In this manner, even by the light emitting device 102 that is not provided with the wavelength selecting material 40, by disposing the blue light emitting color conversion material 32 in the second region 32*a*, blue light emitted from the blue light emitting color conversion material 32 is allowed to be easily emitted to the outside of the light emitting conversion unit 72 without being absorbed by the green light emitting color conversion material 22G and the red light emitting color conversion material 22R Therefore, an increase in amount of a conversion process that the blue light is absorbed again by the green light emitting color conversion material 22G and the red light emitting color conversion material 22R to be converted to green and red light, can be reduced.

Second Embodiment (Light Emitting Device)

Figure 8:
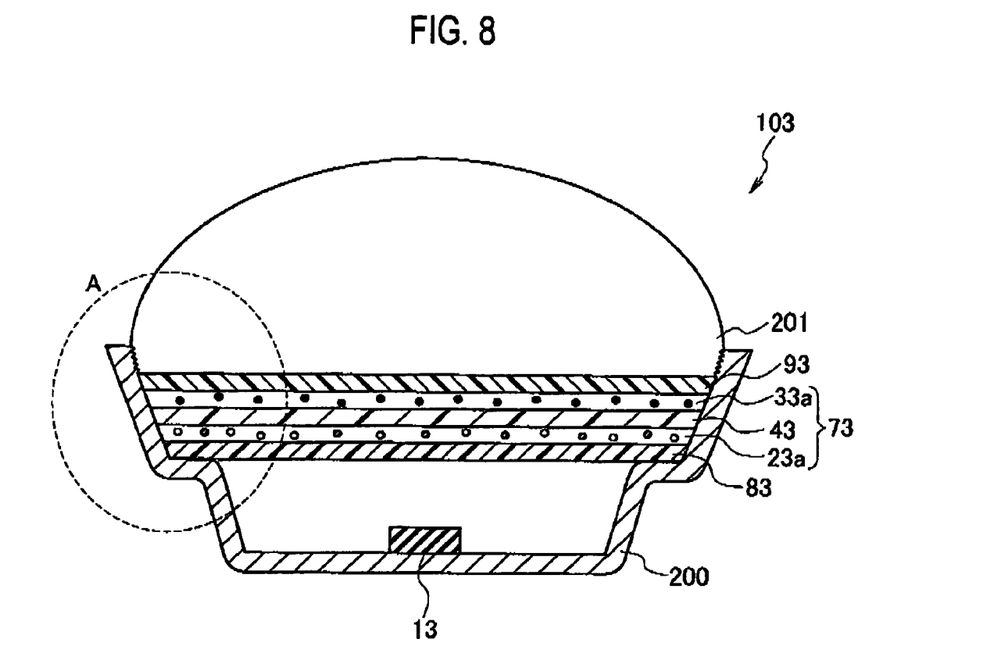
FIG. 8 is a cross sectional view of a light emitting device according to a second embodiment of the present invention.

A light emitting device 103 according to a second embodiment of the present invention will be described below by referring to FIG. 8. FIG. 8 is a cross sectional view showing a light emitting device 103 (white LED) according to the second embodiment, which emits white light.

It is to be noted that with regard to the light emitting device 103 according to the second embodiment, differences with the above-described light emitting device 100 according to the first embodiment will be mainly described.

In the light emitting device 100 according to the first embodiment, as shown in FIG. 3, the light emitting conversion unit 70 is configured by the first region 20*a*, the wavelength selecting material 40, and the second region 30*a*.

In contrast, the light emitting device 103 according to the second embodiment is, as shown in FIG. 8, configured by a cup portion 200, a condenser lens 201 covering the upper portion of the cup portion 200, a light emitting element 13, a light emitting conversion unit 73, a visible light reflection layer 83, and an ultraviolet reflection layer 93. The light emitting conversion unit 73 is configured by a first region 23*a*, a wavelength selecting material 43, and a second region 33*a*, each of which is formed in a sheet form.

Figure 9:
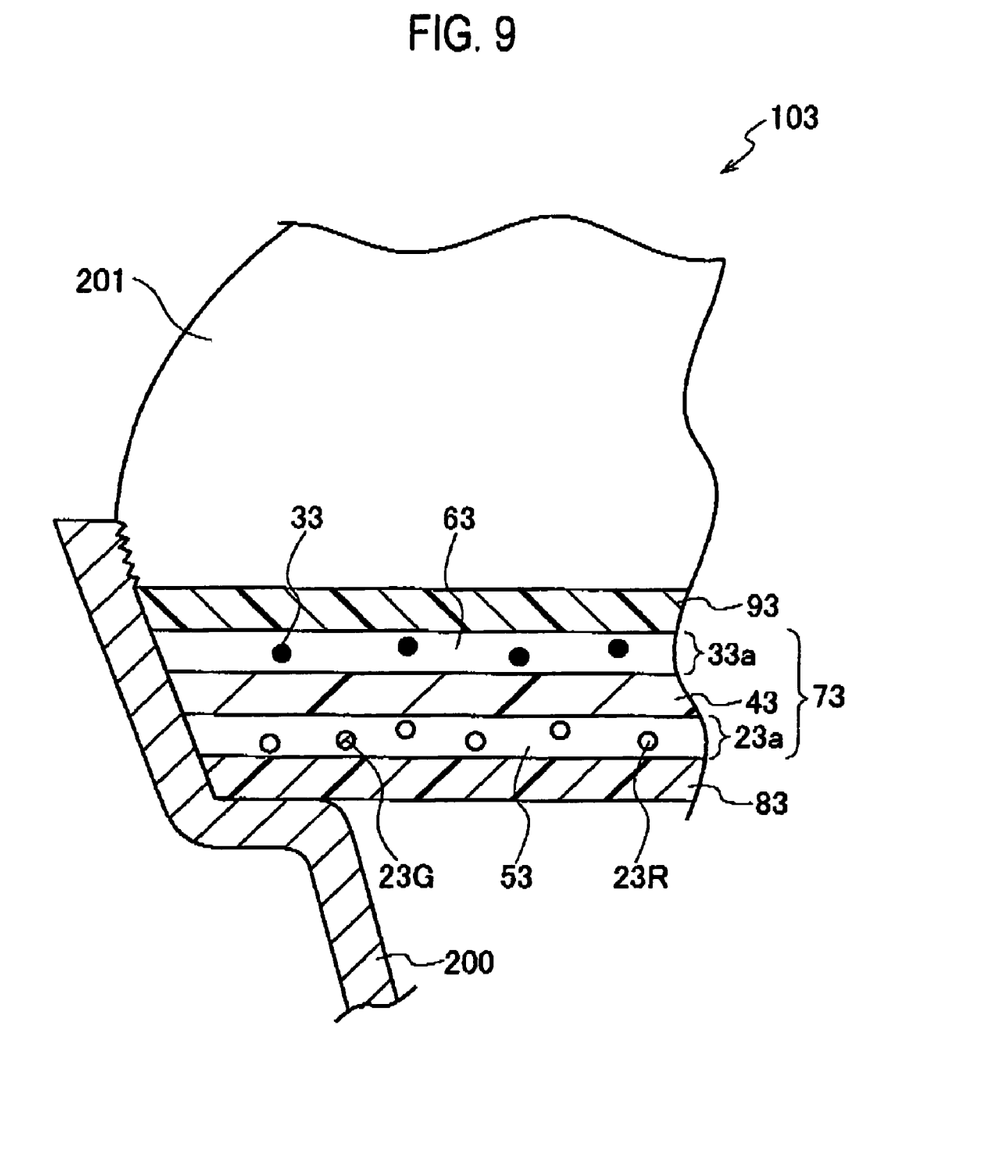
FIG. 9 is a cross sectional view of the light emitting device according to the second embodiment.

With regard to the light emitting conversion unit 73, description will be flier given by referring to FIG. 9, which is an enlarged view of portion A in FIG. 8.

As shown in FIG. 9, the light emitting conversion unit 73 is configured by the first region 23*a*, the wavelength selecting material 43, and the second region 33*a* in this order from the side closer to the light emitting element 13.

In the fist region 23*a*, similar to the first embodiment, a transparent resin 53 is disposed, and in the transparent resin 53, a red light emitting color conversion material 23R and a green light emitting color conversion material 230 are included.

In the second region 33*a*, similar to the first embodiment, a transparent resin 63 is disposed, and in the transparent resin 63, similar to the first embodiment, a blue light emitting color conversion material 33 is included.

In addition, the visible light reflection layer 83 is provided in the region closer to the light emitting element 13 than the light emitting conversion unit 73. The visible light reflection layer 83 has a property to reflect blue, green, and red light, which are visible light. The visible light reflection layer 83 is formed by forming a layer which reflects visible light on the surface of flat glass by using a general evaporation method.

The ultraviolet reflection layer 93 is provided in a region more distant from the light emitting element 13 than the light emitting conversion unit 73. The ultraviolet reflection layer 93 has a property to reflect ultraviolet rays. The ultraviolet reflection layer 93 is formed by forming a layer reflecting ultraviolet rays on the surface of flat glass by using a general evaporation method.

The light emitting device 103 is provided with the light emitting conversion unit 73 between the visible light reflection layer 83 and the ultraviolet reflection layer 93. The light emitting device 103 fixes the visible light reflection layer 83, the light emitting conversion unit 73, and the ultraviolet reflection layer 93 by the cup portion 200 and condenser lens 201.

Specifically, the light emitting device 103, as shown in FIG. 9, supports the visible light reflection layer 83 with a portion of the cup portion 200 and presses the ultraviolet reflection layer 93 with a groove portion provided in the cup portion 200 and the condenser lens 201, thereby fixing the visible light reflection layer 83, the light emitting conversion unit 73, and the ultraviolet reflection layer 93.

(Operations and Effects)

According to the above-described light emitting device 103 of the second embodiment of the present invention, each of the first region 23a, the second region 33a, and the wavelength selecting material 43 is formed in a sheet form, so that the first region 23a, the second region 33a, and the wavelength selecting material 43 can be treated as one set Thereby, the light emitting device 103 can be easily manufactured by providing the light emitting element 13 and the first region 23a, the second region 33a, and the wavelength selecting material 43 as one set on the light emitting element 13.

In addition, by exchanging with sheet of the first region 23a in which the red light emitting color conversion material 231 and the green light emitting color conversion material 23G are increased Or decreased, sheet of the second region 33a in which the blue light emitting color conversion material 33 is increased or decreased, or the like, the light emitting device 103 with a different wavelength of light to be emitted can be easily manufactured.

In addition, in a region closer to the light emitting element 13 than the light emitting conversion unit 73, the visible light reflection layer 38 is provided, so that visible light (blue, green, and red light) emitted to the light emitting element 13 side are reflected to be emitted to the condenser 201.

In addition, in a region more distant from the light emitting element 13 than the light emitting conversion unit 73, the ultraviolet reflection layer 93 is provided, so that ultraviolet rays emitted from the light emitting element 13 are reflected by the ultraviolet reflection layer 93 without being emitted to the outside of the light emitting conversion unit 73. With this, the red light emitting color conversion material 23R, the green light emitting color conversion material 23G and the blue light emitting conversion material 33 absorb the reflected ultraviolet rays to be capable of respectively emitting red, green, and blue light.

Other Embodiments

Various modifications will become possible for those skilled in the art after receiving the teachings of the present disclosure without departing from the scope thereof.

For example, in the present embodiment, only the light emitting device which emits white light has been shown as an example. However, the present invention is not limited to this, and the same effects can be obtained as long as it is provided with a long wavelength conversion material and a short wavelength conversion material.

EXAMPLES

Next, a light emitting device according to the present invention will be specifically described by using examples. In addition, it becomes clear by using a comparative example that high color rendering properties and high efficiency can be balanced. It is to he noted that the light emitting device according to the present invention is not limited to the description shown in the following examples, but it can be implemented by being appropriately changed in a range which does not change the summary thereof.

Example 1

In Example 1, as shown in FIG. 3, a light emitting device in which a light emitting element, a first region including a green light emitting color conversion material and a red light emitting color conversion material, a wavelength selecting material, and a second region including a blue light emitting color conversion material are provided is manufactured. Here, a GaN-based material is used for the light emitting element, and a peak of a light emitting wavelength is between 380 and 420 nm.

Firstly, processing of manufacturing the green and the red light emitting color conversion materials is carried out Here, as shown in FIG. 3, the first region including the green light emitting color conversion material and the red light emitting color conversion material is formed. The green light emitting color conversion material and the red light emitting color conversion material used here were materials of oxidant system, and light to be emitted had peaks at the vicinity of 530 nm and 620 nm, respectively.

Specifically, the green light emitting color conversion material and the red light emitting color conversion material with particle diameters between 3 and 10 μm and specific gravities between 3.5 and 4.5 g/cm$^3$ are dispersed in a silicon resin to manufacture the silicon resin in which the green light emitting color conversion material and the red light emitting color conversion material are mixed. At this time, the green light emitting color conversion material and the red light emitting color conversion material are weighed such that the green light emitting color conversion material and the red light emitting color conversion material respectively become 6% and 24% in weight ratio in relation to the silicon resin applied to the entire light emitting conversion unit.

In order to cause the green light emitting color conversion material and the red light emitting color conversion material to be sufficiently dispersed, by using an agitator, they are agitated for five minutes at a revolution of 2000 rpm and a rotation of 800 rpm. Thereafter, by the vacuuming using a rotary pump, degassing is carried out for 10 minutes. It is to be noted that a method for physically agitating with a blade may be used for agitating, and a well-known method such as the revolution method may be used for degassing.

Thereafter, the light emitting element is disposed and a transparent resin is applied by the well-known method onto a mounting member to be a wired light emitting conversion unit and then is cured under the heating condition of 150° C. and three hours.

Next, processing of manufacturing a wavelength selecting material is carried out. Here, as shown in FIG. 3, the wavelength selecting material is formed. For the wavelength selecting material, a blocking cut filter with cut wavelength, which is 50% and more, between 420 nm and 510 nm is used.

Specifically, the wavelength selecting material is formed on the surface, which is in the outside of the first region and on the opposite side of the light emitting element. The wavelength selecting material can be made of a material which itself is in a film form or a material which is mixed in a resin.

Next, processing of manufacturing the blue light emitting color conversion material is carried out. Here, as shown in FIG. 3, the blue light emitting color conversion material is formed. The blue light emitting color conversion material used here is a material of oxidant system and light to be emitted has a peak in the vicinity of 460 nm.

Specifically, the blue light emitting color conversion material with particle diameters between 3 to 10 μm and specific gravities between 3.5 to 4.5 g/cm³ is dispersed in the silicon resin to manufactured the silicon resin in which the blue light emitting color conversion material is mixed. At this time, the blue light emitting color conversion material is weighed so as to become 10% in weight ratio in relation to the silicon resin applied to the entire light emitting conversion unit.

In order to cause the blue light emitting color conversion material to be sufficiently dispersed, by using an agitator, it is agitated for five minutes at a revolution of 2000 rpm and a rotation of 800 rpm. Thereafter, by the vacuuming using a rotary pump, degassing is carried out for 10 minutes. It is to be noted that a method for physically agitating with a blade may be used for agitating and a well-known method such as the revolution method may be used for degassing.

Thereafter, a shell-type LED is manufactured by the well-known method. At that time, a silicon resin is used for the resin.

In this manner, the light emitting device according to Example 1 is manufactured.

Example 2

In Example 2, as shown in FIG. 7, a light emitting device in which a light emitting element, a first region, and a second region are provided is manufactured In Example 2, a light emitting device in which the wavelength selecting material is removed from the device in Example 1, and similar to Example 1, a GaN-based material is used for the light emitting element and a peak of the light emitting wavelength is between 390 and 410 nm is used. In addition, a manufacturing method in Example 2 is similar to that of Example 1 except the point that the wavelength selecting material is not formed.

Example 3

In Example 3, as shown in FIG. 8, a light emitting device in which a cup portion, a condenser lens covering the upper portion of the cup portion, a light emitting element, a light emitting conversion unit, a visible light reflection layer, and an ultraviolet reflection layer are provided is manufactured.

The light emitting conversion unit is configured by a first region including a green light emitting color conversion material and a red light emitting color conversion material, a wavelength selecting material, and a second region including a blue light emitting color conversion material, each of which is formed in a sheet form.

The light emitting device in Example 3 is provided with the light emitting element and light emitting color conversion materials, similar to the device in Example 1, and weight ratio thereof in relation to the silicon resin applied to the entire light emitting conversion unit is also set in a similar manner as in Example 1.

Specifically, similar to Example 1, the sheet including the green light emitting color conversion material and the red light emitting color conversion material is weighed such that the green light emitting color conversion material and the red light emitting color conversion material respectively become 6% and 24% in weight ratio in relation to the silicon resin applied to the entire light emitting conversion unit. In order to cause the green light emitting color conversion material and the red light emitting color conversion material to be sufficiently dispersed, they are agitated in a similar manner as in Example 1. Thereafter, by the vacuuming using a rotary pump, degassing is carried out for 10 minutes.

After the obtained transparent resin is formed so as to have a thickness of approximately 100 μm, it is cured under the heating condition of 150° C. and three hours. Similarly, the second region including the blue light emitting color conversion material is manufactured.

Comparative Example 1

In Comparative example 1, as shown in FIG. 1, a light emitting device in which a light emitting element, a green light emitting color conversion material, a red light emitting color conversion material, and a blue light emitting color conversion material are provided is manufactured.

Comparative example 1 is different from Examples 1 to 3 in that the first and second regions are not provided and the green light emitting color conversion material, the red light emitting color conversion material, and the blue light emitting color conversion material are dispersed in the transparent resin.

The light emitting device in Comparative example 1 is manufactured by using, similar to Example 1, the light emitting element, the green light emitting color conversion material, the red light emitting color conversion material, the blue light emitting color conversion material, and the like.

In addition, a manufacturing method used in Comparative example 1 is similar to that used in Example 1 except the point that the green light emitting color conversion material, the red light emitting color conversion material, and the blue light emitting color conversion material are mixed together and dispersed in the transparent resin.

(Testing Procedure)

Next, color rending indices and color temperatures of Examples 1 to 3 and Comparative example 1, as manufactured in the above described manners, and conversion efficiencies of the color conversion materials are measured. It is to be noted that the color rending index means a numerical value representing how closely a light source makes the color of an object appear to human eyes in comparison with the color of the same object lighted by sunlight, when natural light is set to 100. In addition, the color temperature means a temperature when light of a targeted color becomes a color equal to a color to be emitted when a black body is heated. In addition, the conversion efficiency of the color conversion material means a proportion of the output of light emitted from a color conversion material in relation to the input of light absorbed by the color conversion material.

(Testing Result)

Results of the measured color rendering indices and color temperatures in Examples 1 to 3 and Comparative example 1, and conversion efficiencies of the color conversion materials will be shown in Table 1.

TABLE 1

|  | Example 1 | Example 2 | Example 3 | Comparative example 1 |
|---|---|---|---|---|
| color rendering index Ra | 83 | 82 | 85 | 82 |
| red color rendering index R9 | 65 | 63 | 70 | 57 |
| color temperature (K) | 3000 | 3000 | 3000 | 3000 |
| conversion efficiency (%) | 28 | 22 | 27 | 18 |

The color rendering indices and the color temperatures of Examples 1 to 3 and Comparative example 1 showed substantially comparable values and white light is emitted.

On the contrary, the conversion efficiencies of the color conversion materials in Examples 1 to 3 are improved by 20% or more in relation to the conversion efficiency of the color conversion materials of Comparative example 1. In particular, the color conversion efficiencies of the color conversion materials in Examples 1 and 3 are improved by 50% or more in relation to the conversion efficiency of the color conversion materials of Comparative example 1.

This is because it is believed that in Comparative example 1, the blue light emitted from the blue light emitting color conversion material is absorbed by the green light emitting color conversion material and the red light emitting color conversion material.

In addition, the conversion efficiency of the color conversion materials of Example 1 is improved in comparison to the conversion efficiency of the color conversion materials in Example 2.

This is because it is believed that the wavelength selecting material is provided and the blue light emitted from the blue light emitting color conversion material in the second region is not absorbed by the green light emitting color conversion material and the red light emitting color conversion material in the first region.

What is claimed is:

1. A light emitting device, comprising:
    a light emitting element configured to emit light with a first wavelength; and
    a light emitting conversion unit configured to convert the light with the first wavelength by using wavelength conversion materials including a short wavelength conversion material and a long wavelength conversion material, the short wavelength conversion material emits light with a second wavelength longer in wavelength than the light with the first wavelength by absorbing the light with the first wavelength, and the long wavelength conversion material emits light with a wavelength longer than the second wavelength by absorbing the light with the first wavelength,
    wherein a proportion of the short wavelength conversion material of the wavelength conversion materials included in a first region of the light emitting conversion unit is smaller than a proportion of the short wavelength conversion material of the wavelength conversion materials included in the entire light emitting conversion unit, and
    a proportion of the short wavelength conversion material of the wavelength conversion materials included in a second region, which is a region more distant from the light emitting element than the first region in the light emitting conversion unit, is larger than a proportion of the short wavelength conversion material of the wavelength conversion materials included in the entire light emitting conversion unit, and
    wherein the short wavelength conversion material is included more in the second region than the long wavelength conversion material.

2. A light emitting device, comprising:
    a light emitting element configured to emit light with a first wavelength;
    a light emitting conversion unit configured to convert the light with the first wavelength by using wavelength conversion materials including a short wavelength conversion material and a long wavelength conversion material, the short wavelength conversion material emits light with a second wavelength longer in wavelength than the light with the first wavelength by absorbing the light with the first wavelength, and the long wavelength conversion material emits light with a wavelength longer than the second wavelength by absorbing the light with the first wavelength, and,
    a wavelength selecting material, which penetrates light with a wavelength longer than the first and the second wavelengths, and which reflects the light with the second wavelength, the wavelength selecting material is provided between the first region and the second region,
    wherein a proportion of the short wavelength conversion material of the wavelength conversion materials included in a first region of the light emitting conversion unit is smaller than a proportion of the short wavelength conversion material of the wavelength conversion materials included in the entire light emitting conversion unit, and
    a proportion of the short wavelength conversion material of the wavelength conversion materials included in a second region, which is a region more distant from the light emitting element than the first region in the light emitting conversion unit, is larger than a proportion of the short wavelength conversion material of the wavelength conversion materials included in the entire light emitting conversion unit.

3. The light emitting device according to claim 1, further comprising a wavelength selecting material, which penetrates light with a wavelength longer than the first and the second wavelengths, and which reflects the light with the second wavelength, the wavelength selecting material is provided between the first region and the second region.

4. The light emitting device according to claim 2, wherein each of the first region, the second region, and the wavelength selecting material is formed in a sheet form.

5. The light emitting device according to claim 3, wherein each of the first region, the second region, and the wavelength selecting material is formed in a sheet form.

6. A light emitting device, comprising:
    a light emitting element configured to emit light with a first wavelength; and
    a light emitting conversion unit configured to convert the light with the first wavelength by using wavelength conversion materials including a short wavelength conversion material and a long wavelength conversion material, the short wavelength conversion material emits light with a second wavelength longer in wavelength than the light with the first wavelength by absorbing the light with the first wavelength, and the long wavelength conversion material emits light with a wavelength longer than the second wavelength by absorbing the light with the first wavelength,
    wherein a proportion of the short wavelength conversion material of the wavelength conversion materials included in a first region of the light emitting conversion unit is smaller than a proportion of the short wavelength conversion material of the wavelength conversion materials included in the entire light emitting conversion unit, and
    a proportion of the short wavelength conversion material of the wavelength conversion materials included in a second region, which is a region more distant from the light emitting element than the first region in the light emitting conversion unit, is larger than a proportion of the short wavelength conversion material of the wavelength conversion materials included in the entire light emitting conversion unit, and
    wherein said first region and said second region each comprise an amount of short and long wavelength conversion material and wherein in the first region the proportion of long wavelength conversion material is greater than the proportion of the short wavelength material and in the second region the proportion of short wavelength conversion material is greater than the proportion of the long wavelength conversion material.

7. The light emitting device of claim 6, further comprising:
a wavelength selecting material, which penetrates light with a wavelength longer than the first and the second wavelengths, and which reflects the light with the second wavelength, the wavelength selecting material is provided between the first region and the second region.

8. The light emitting device of claim 7, wherein each of the first region, the second region, and the wavelength selecting material is formed in a sheet form.

* * * * *